United States Patent
Su et al.

(10) Patent No.: US 8,558,336 B2
(45) Date of Patent: Oct. 15, 2013

(54) SEMICONDUCTOR PHOTODETECTOR STRUCTURE AND THE FABRICATION METHOD THEREOF

(75) Inventors: Tzung-I Su, Yun-Lin County (TW);
Bang-Chiang Lan, Taipei (TW);
Chao-An Su, Kaohsiung County (TW);
Hui-Min Wu, Hsinchu County (TW);
Ming-I Wang, Taipei County (TW);
Chien-Hsin Huang, Taichung (TW);
Tzung-Han Tan, Taipei (TW); Min Chen, Taipei County (TW); Meng-Jia Lin, Changhua County (TW); Wen-Yu Su, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 364 days.

(21) Appl. No.: 12/542,671

(22) Filed: Aug. 17, 2009

(65) Prior Publication Data
US 2011/0037133 A1    Feb. 17, 2011

(51) Int. Cl.
*H01L 31/0232*   (2006.01)
*H01L 31/18*   (2006.01)
*H01L 31/08*   (2006.01)

(52) U.S. Cl.
USPC ........................................................ 257/432

(58) Field of Classification Search
USPC ........................................................ 257/432
See application file for complete search history.

(56) References Cited

U.S. PATENT DOCUMENTS

| | | | |
|---|---|---|---|
| 5,721,429 A * | 2/1998 | Radford et al. ............ | 250/338.4 |
| 6,147,349 A * | 11/2000 | Ray ............................ | 250/338.4 |
| 7,220,632 B2 | 5/2007 | Jones | |
| 7,262,117 B1 | 8/2007 | Gunn, III | |
| 2004/0043584 A1 | 3/2004 | Thomas | |
| 2005/0184353 A1* | 8/2005 | Mouli ............................ | 257/446 |
| 2009/0101909 A1* | 4/2009 | Chen et al. ..................... | 257/65 |

* cited by examiner

*Primary Examiner* — Matthew W Such
*Assistant Examiner* — Robert Carpenter
(74) *Attorney, Agent, or Firm* — Winston Hsu; Scott Margo

(57) ABSTRACT

A semiconductor photodetector structure is provided. The structure includes a substrate, a photodetecting element and a semiconductor layer disposed on the photodetecting element. The substrate includes a first semiconductor material and includes a deep trench. The surface of the deep trench includes a first type dopant. The photodetecting element is disposed in the deep trench. The photodetecting element includes a second semiconductor material. The semiconductor layer includes a second type dopant.

14 Claims, 6 Drawing Sheets

SEMICONDUCTOR PHOTODETECTOR STRUCTURE AND THE FABRICATION METHOD THEREOF

BACKGROUND OF THE INVENTION

1. Field of the Invention

The invention relates to a semiconductor photodetector structure, especially to a photodetector structure that includes germanium semiconductor material.

2. Description of the Prior Art

Conventional copper cables are less and less capable of carrying more and more signals to travel a longer and longer distance due to the physical limitation of electrical resistance and signal delays. Naturally, optical fibers meet the demand of carrying very large information to travel a very long distance so they replace the conventional copper cables to be the medium of long distance carrier of information because one single optical fiber allows multiple beams of light of different wavelengths, each carrying different information to travel at the speed of light without mutual interference and without attenuating too much after traveling an extreme long distance.

Light of different wavelengths in the form of pulse signals constitutes the basic principle of transmission by optical fiber. However, such basic principle of transmission is not compatible with the basic principle of transmission by electron current in the current electronic devices to carry and to transmit signals. In order to from a transform medium between the optical fiber transmission and the electron current transmission, the photo-detector is deemed to be a convenient tool.

The photo-detector is an important photo-electrical transform unit. The photo-detector is capable of transforming the optical signals to electrical signals (into voltage or current), so it can transform the optical pulse signals in the optical fibers to become the electrical signals which can be carried, transmitted or used by ordinary electronic devices. Amongst them, the PIN (p-intrinsic-n photodiode) which has the advantages of easy to be manufactured, high reliability, low noise, compatible with low-voltage amplifier circuits and very wide bandwidth becomes one of the most widely used photo-detector.

The basic operational mechanism of the PIN photodiode is that when the incident light hits the p-n junction of the semiconductor, the electrons in the valence band of the semiconductor would absorb the energy of the photons in the incident light and jump over the forbidden band to arrive at the conduction band, which means, the incident photons create electrons, called photo-electrons, in the conduction band of the semiconductor if the photons have sufficient energy. Simultaneously, an electrical hole is left behind in the valence band and an electron-hole pair, or called photocarrier, is thus generated, which is also known as the photoelectric effect of the semiconductors. Afterwards, the photo-electron and the corresponding hole are quickly separated under the influence of an inner electric field and an outer negative bias to be respectively collected at the positive electrode and the negative electrode. Therefore, a photo-current appears in the outer circuit.

In order to enhance the operational performance of the PIN photodiode, the current technology integrates the Ge semiconductor material into the Si substrate to accomplish an optical communication of wide wavelength because Ge is deemed to have much higher carrier mobility than Si. The importance of integration of Ge semiconductor material into the Si substrate lies in the essential qualities of fast, effective and low noise. US Patent Publication 2004/0043584 discloses a method to integrate the CMOS and Ge photodetector on a silicon substrate. The method is to form a plurality of shallow trenches, and after deposition of a germanium layer, an etching and a CMP step are performed to form a germanium photodetector on the silicon substrate. However, the germanium layer is non-selectively deposited on the substrate, and should be etched and planarized, making the roughness of the germanium layer hard to control and lowering the photodetecting quality. U.S. Pat. No. 7,220,632 and U.S. Pat. No. 7,262,117 disclose a germanium photodetector fabricating method as well. However, the direction of the light input and the diode channel is horizontal, which may cause more noise. And the photodetector is fabricated on a SOI substrate, which increases the manufacturing cost.

Accordingly, it is needed to provide a novel germanium photodetector structure and the method for making the germanium photodetector to more effectively integrate the manufacturing process of the novel germanium photodetector with the traditionally fully-developed MOS manufacturing process to lower the manufacturing cost.

SUMMARY OF THE INVENTION

The present invention provides a germanium photodetector structure and the method for making the same that can integrate into the traditional MOS manufacturing process and can obtain better photodetector quality.

According to the claimed invention, the present invention provides a semiconductor photodetector structure. The structure includes a substrate, a photodetecting element and a semiconductor layer disposed on the photodetecting element. The substrate includes a first semiconductor material and includes a deep trench. The surface of the deep trench includes a first type dopant. The photodetecting element is disposed in the deep trench. The photodetecting element includes a second semiconductor material. The semiconductor layer includes a second type dopant.

According to the claimed invention, the present invention provides another semiconductor photodetector structure. The structure includes a substrate and a photodetecting element. The substrate includes a first semiconductor material and includes a deep trench, wherein the surface of the deep trench includes a first type dopant and the deep trench includes a sloped sidewall. The photodetecting element is disposed in the deep trench, wherein the photodetecting element includes a second semiconductor material and the photodetecting element includes a sidewall with a similar slope as that of the deep trench.

According to the claimed invention, the present invention provides a method of fabricating a semiconductor photodetector structure. The method includes: providing a substrate, wherein the substrate includes a first semiconductor material and the substrate includes a photodetecting region and an active region; then forming a shallow trench between the photodetecting region and the active region of the substrate; then forming a deep trench in the photodetecting region of the substrate; next, forming an active element in the active region of the substrate; and providing an epitaxial growth process to form a photodetector element in the deep trench, wherein the photodetector element comprises a second semiconductor material.

The fabricating method can integrate with traditional MOS manufacturing process and is compatible with existing technology and available to general silicon substrate.

These and other objectives of the present invention will no doubt become obvious to those of ordinary skill in the art after

DETAILED DESCRIPTION

Please refer to FIG. 1 to FIG. 11, illustrating the schematic diagrams of the method of fabricating the semiconductor photodetector structure in the present invention. Please refer to FIG. 1. First, a substrate 100 is provided. Then, an oxide layer 102 and a nitride layer 104 are deposited on the substrate 100. The substrate 100 may include general semiconductor material, such as a silicon substrate.

Figure 1:
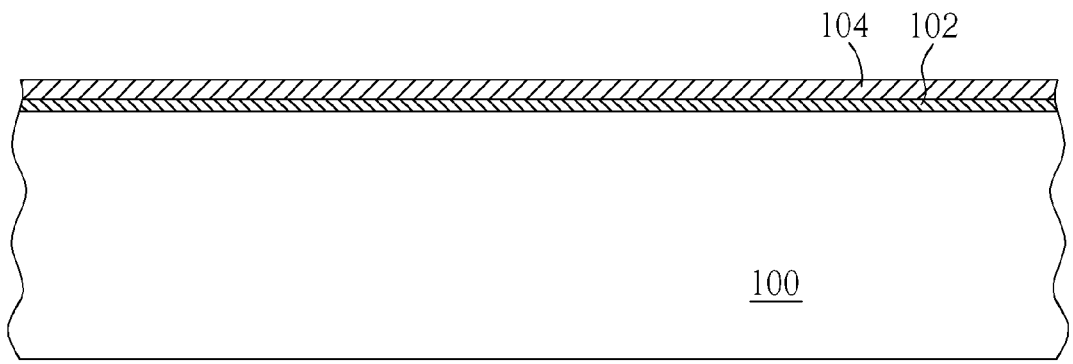
FIG. 1 to FIG. 11 illustrate the schematic diagrams of the method of fabricating the semiconductor photodetector structure in the present invention.
Figure 2:
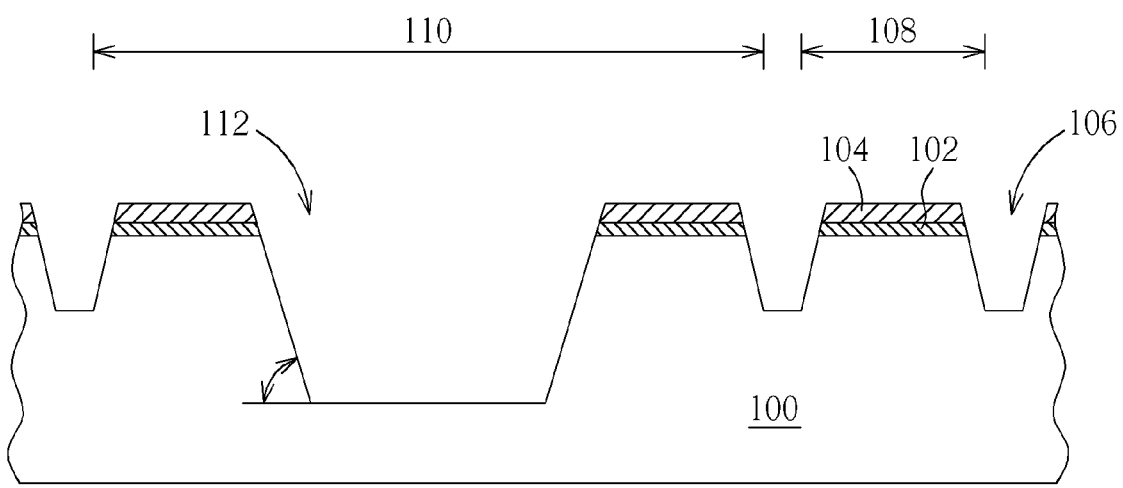

Then an active region 108 and a photodetecting region 110 on the substrate 100 are defined. In the follow-up steps, an active component such as a MOS will be formed in the active region 108 and a photodetector will be formed in the photodetecting region 110. Next, a patterning process is provided to form a plurality of shallow trenches 106 around the active region 108. Generally, the shallow trench has a depth about 300-400 nm. Then, another patterning process is performed to form a deep trench 112 in the photodetecting region 110 of the substrate 100. The deep trench 112 has a sloped sidewall, for example, the deep trench 112 has a sloped angle α as shown in FIG. 2. The depth of the deep trench 112 is greater than the shallow trench 106. For example, the size of the deep trench 112 is about 30 µm in diameter and 1 µm in depth. The depth of the deep trench 112 can be adjusted with different product needs and the depth of the deep trench 112 will determine the germanium layer growth space of the photodetector diode in the follow-up steps.

Figure 3:
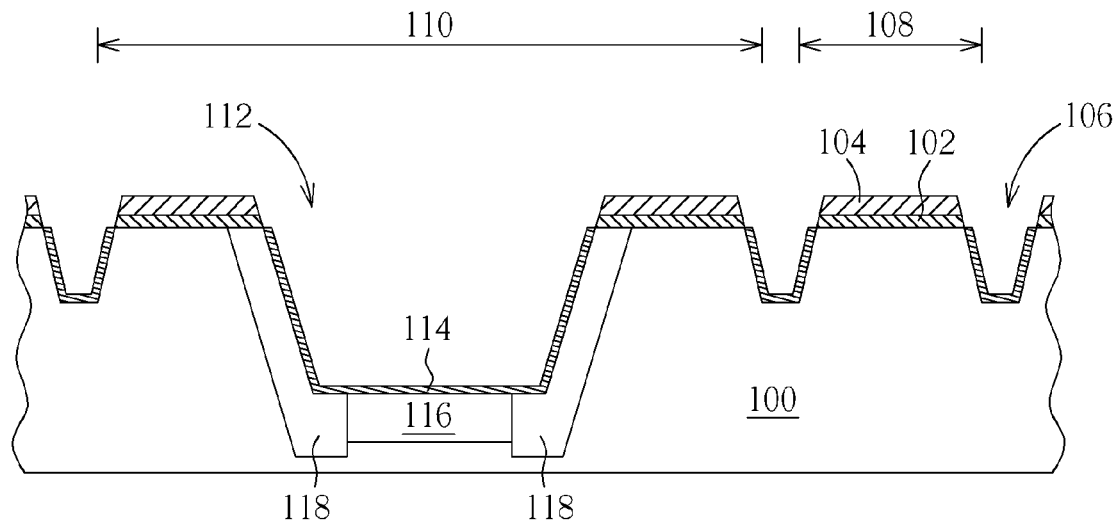

Please refer to FIG. 3. An oxide layer is formed on the surface of the deep trench 112 and the shallow trench 106 on the substrate 100. A high temperature oxidation process is carried out so the silicon substrate 100 on the surface of the deep trench 112 and the shallow trench 106 is oxidized to form a liner oxide layer 114. Then at least an implant process is carried out to form a first doped region 116 on the bottom of the deep trench 112 and to form a first heavily doped region 118 on the sidewall of the deep trench 112. The first doped region 116 and the first heavily doped region 118 have the same dopant type, but the doping dose may be different. For example, the first doped region 116 and the first heavily doped region 118 may both include N-type dopant or both include P-type dopant, and the dose of the first heavily doped region 118 is greater than the first doped region 116 so as to define the electron conducting pathway of the photodetector diode.

Figure 4:
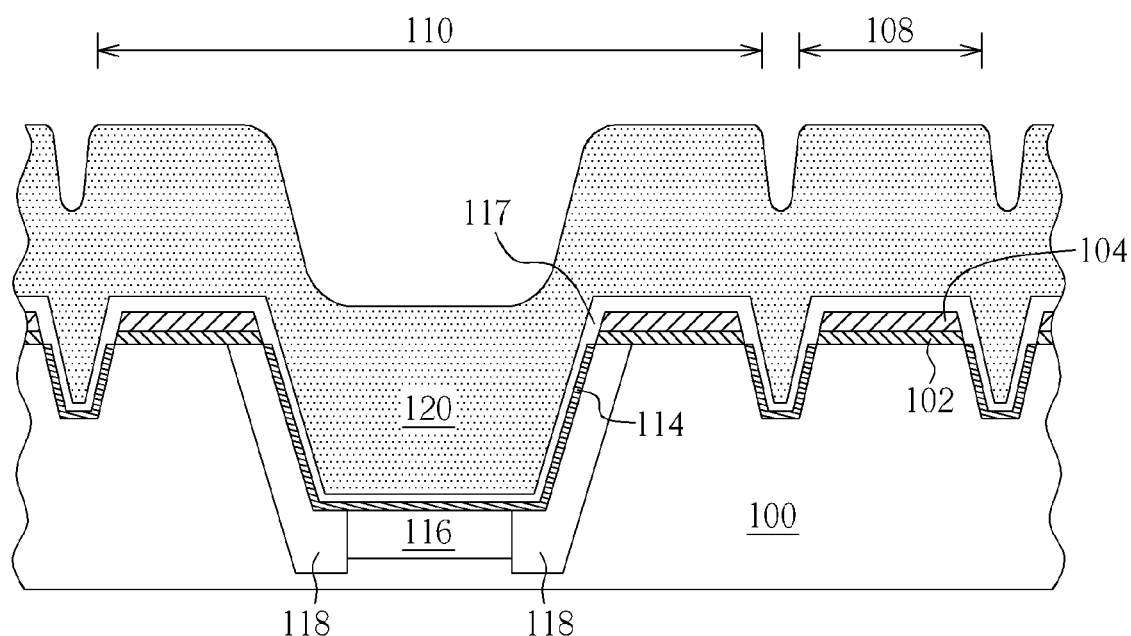

Refer to FIG. 4. A liner nitride 117 is deposited on the substrate 100, such as a silicon nitride layer, to cover the surface of the deep trench 112 and the shallow trench 106 on the substrate 100. And then an isolation layer 120 is deposited on the substrate 100. The isolation layer 120 may be formed, for example, by a high-density plasma chemical deposition (HDCVD). The isolation layer 120 is usually a silicon dioxide layer or other materials for general shallow trench isolation. The thickness of the isolation layer 120 depends on the depth of the deep trench 112, which should be able to fulfill the deep trench 112.

Figure 5:
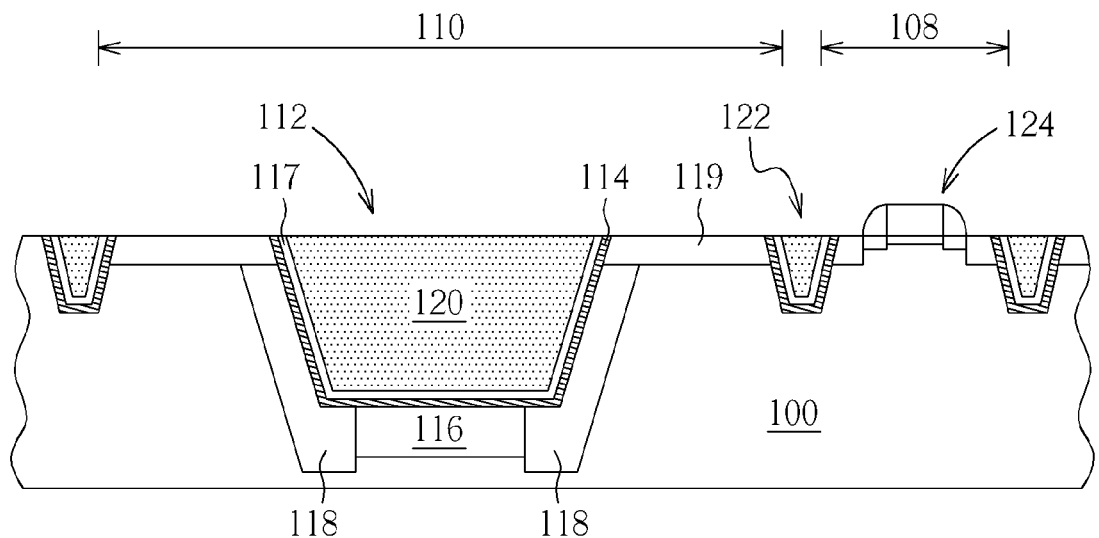

Then as shown in FIG. 5, a planarization step, such as chemical mechanical planarization (CMP), is performed to remove the isolation layer 120, the liner nitride layer 117 and the nitride layer 104 on the surface of the substrate 100, making the isolation layer 120 fill the shallow trench 106. A shallow trench isolation (STI) 122 is thus formed. Then the surface of substrate 100 is washed and the residual oxide layer 102 is removed. A standard MOS manufacturing process is then carried out to form a MOS 124 in the active region 108 which is surrounded by the STI 122. Because the first doped region 116 and the first heavily doped region 118 are covered by the liner oxide layer 114, the liner nitride layer 117 and the isolation layer 120, the doped structure will not be affected when proceeding with the standard MOS manufacturing process. In addition, with the standard metal-oxide semiconductor process to form the source/drain doping steps, a second heavily doped region 119 is simultaneously formed on the surface of the substrate 100 in the photodetecting region 110 wherein the second heavily doped region 119 essentially contacts the first heavily doped region 118 in the deep trench 112.

Figure 6:
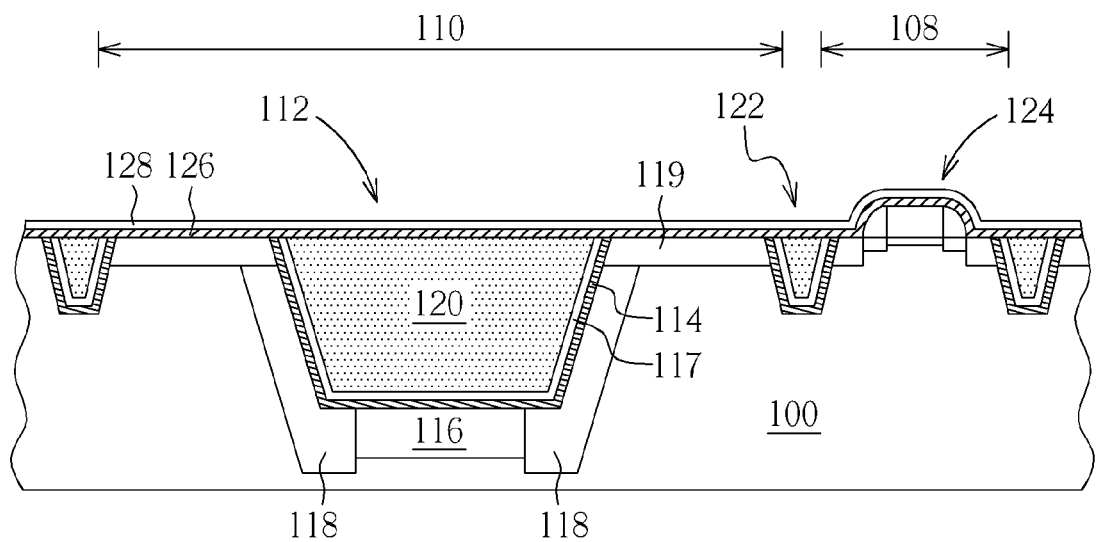

Please refer to FIG. 6. A mask oxide layer 126 and a mask nitride layer 128 are deposited on the substrate 100 in series, covering on the isolation layer 120 on the deep trench 112 and the MOS 124. It is worth noting that, in order not to affect the already formed components in the active region 108, for example, to avoid damage on the source/drain doping profile of the MOS 124, these deposition processes may be carried out in a relatively low temperature, such as using an atmospheric pressure chemical vapor deposition (APCVD) or a plasma chemical vapor deposition (PECVD), etc.

Figure 7:
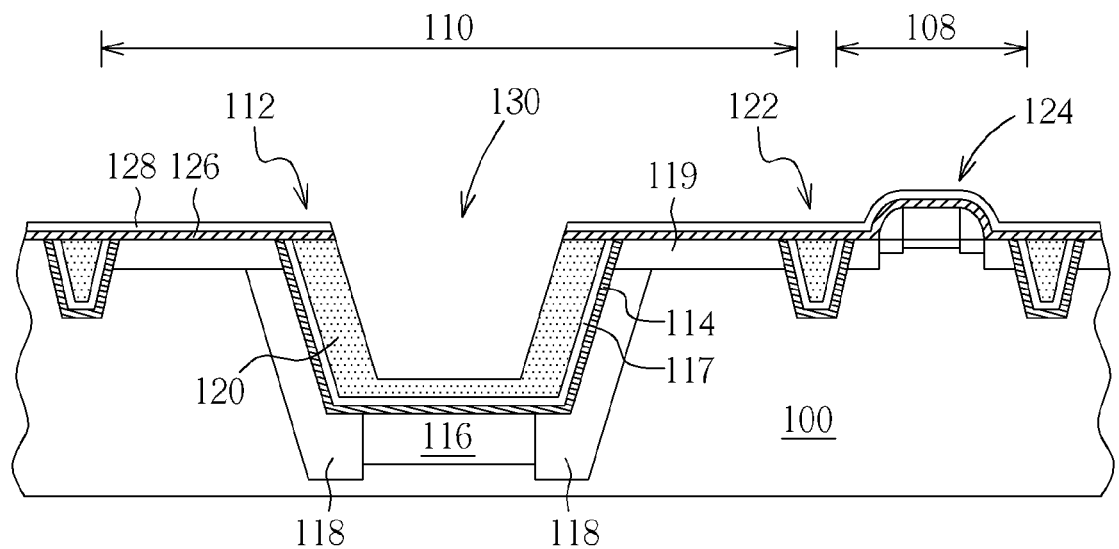

Please refer to FIG. 7. A patterning process is carried out by using a photoresist layer (not shown). An opening is formed through the mask nitride layer 128, then removing the photoresist layer. By a dry etch process, the mask nitride layer 128 is used as a hard mask to form a second trench 130 structure in the isolation layer 120 in the deep trench 112. Similarly, by controlling the etching recipe, the second trench 130 has a sloped sidewall. In the preferred embodiment, the sidewall of the second trench 130 has the similar slope as that in the deep trench 112. After the dry etching, there is still a portion of isolation layer 120 remained on the bottom of the second trench 130 and the remained isolation layer 120 is corresponding to the first doped region 116. The bottom area of the second trench 130 is less than the first doped region 116 such that a self-alignment purpose may be automatically achieved in the following steps. Because a dry etch process is used to rapidly remove the isolation layer 120, in order to avoid damages on the first doped region 116 on the bottom surface of the deep trench 112 during the dry etch process, the dry etching does not reach to the first doped region 116. That is, after the dry etching process, there is still a portion of isolation layer 120 remained on the bottom of the second trench 130 to protect the first doped region 116 therebelow.

Figure 8:
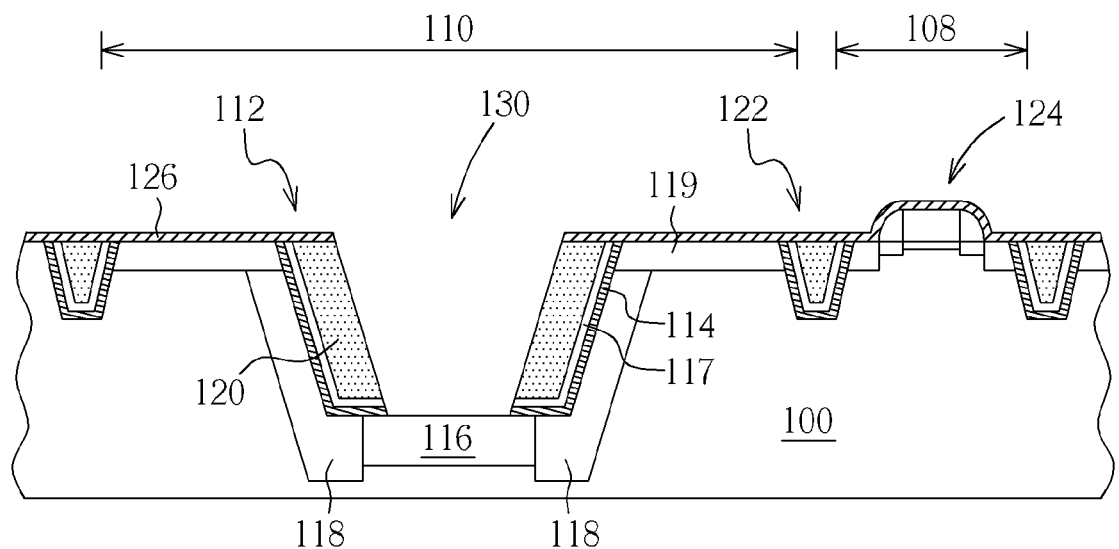

As shown in FIG. 8, a wet etching step is provided to remove the isolation layer 120 on the bottom of the second trench 130, and further remove the liner nitride layer 128, the liner oxide layer 126 in the deep trench 112 and the mask nitride layer 128 on the substrate 100. The first doped region 116 is thus exposed. Because the bottom area of the second trench 130 is smaller than the first doped region 116, so in the wet etching step, the first heavily doped region 118 is not exposed.

Figure 9:
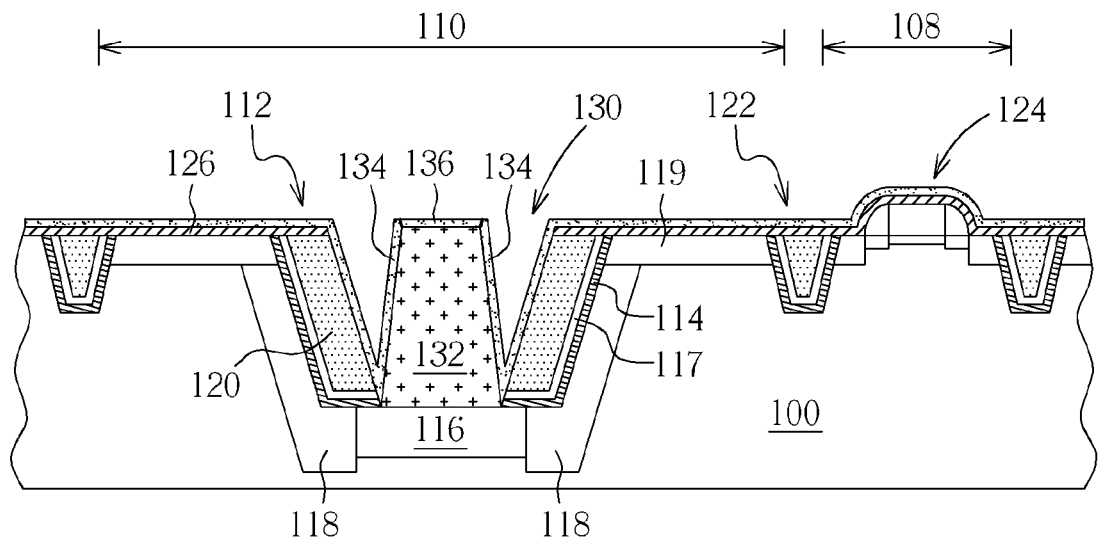

Please refer to FIG. 9. A selective epitaxial growth process is provided to grow the germanium layer 130 on the bottom of the second trench 130, that is, to grow on the surface of the first doped region 116. In this epitaxial growth process, because the substrate 100 on the other region has been covered by the mask oxide layer 126, the mask nitride layer 128 and the isolation layer 120, the germanium does not grow on these regions but selectively only grows on the first doped area 116. In one preferred embodiment, the growth temperature is about 400 to 600 degrees Celsius and the GeH$_4$ material is used therewith. In addition, by regulating the pressure of the epitaxial growth process, different forms of germanium layer 132 can be formed. For example, in an ultra high vacuum environment for the epitaxial growth process, a prism or a cylindrical shape of the germanium layer 132 is formed, which has a three-dimensional tapered shape shrinking from bottom to top, as shown in FIG. 9. On the other hand, if the epitaxial growth process is in a low-pressure environment, such as using LPCVD, the germanium layer 132 will grow along the sloped sidewall of the second trench 130, filling the entire second trench 130, and slightly prominent on the surface of the substrate 100. The following steps show the prior embodiment for example, but the later embodiment is also applicable.

As shown in FIG. 9, after the formation of germanium layer 132, a semiconductor layer 134 is deposited on the substrate 100 to cover the surface of the germanium layer 132. The semiconductor layer 134 can be single crystal silicon, amorphous silicon or polysilicon. Then, an ion implant process is carried out to form a second doped region 136 on the semiconductor layer 134 that is above the germanium layer 132. The dopant type of the second doped region 136 and the first doped region 116 are different, for example, when the first doped region has an N-type dopant, the germanium layer 132 is undoped and the second doped region 136 has a P-type dopant, such that a photosensitive element PIN structure is formed and the photosensitive element PIN structure can have better transmission efficiency and better element property. In another embodiment, an implant process can be carried out instead of forming a semiconductor layer 134, so the second doped region 136 can be directly formed on the surface of the germanium layer 132.

Figure 10:
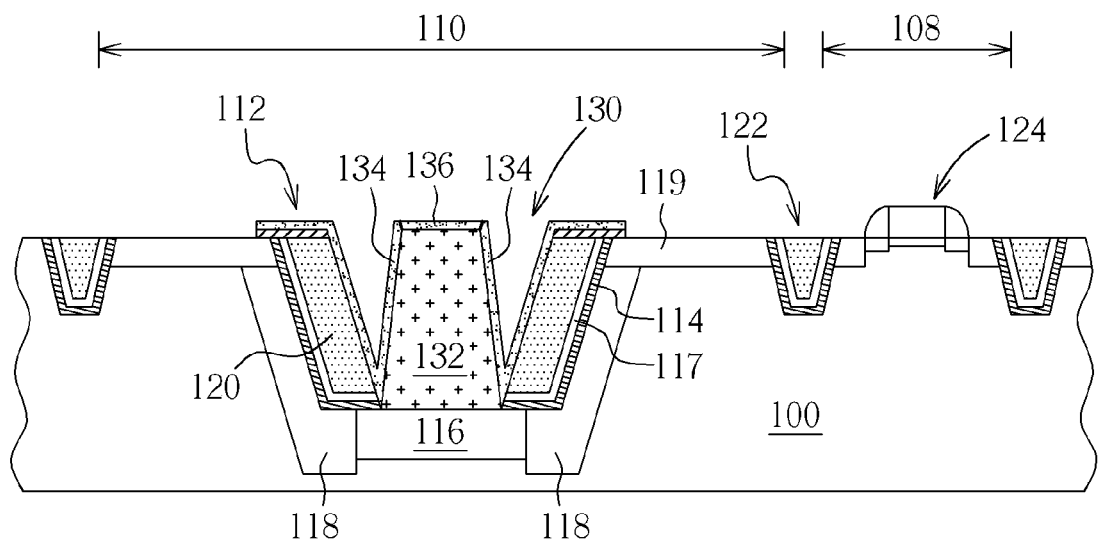
Figure 11:
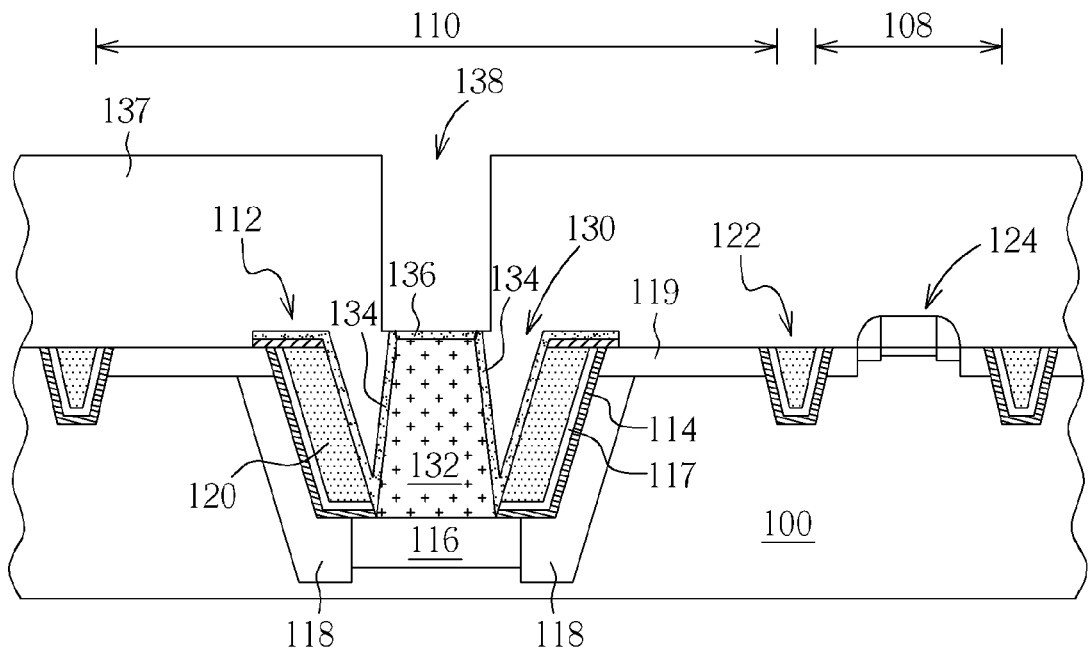

As shown in FIG. 10, a patterning process is carried out to remove the semiconductor layer 134, the mask oxide layer 126 and the mask nitride layer 128 not in the deep trench 112. Then, a conventional salicide process can be performed to form a salicide layer (not shown) such as cobalt silicide or nickel silicide on the gate and the source/drain region of the MOS 124. Finally, as shown in FIG. 11, a dielectric layer structure 137 including one or a plurality of dielectric layers wherein a interconnection structure is disposed therein is deposited on the substrate 100. Depending on different demands for products, a waveguide 138 can be formed in the dielectric layer structure 137 above the photodetector structure to enhance the photo-detecting ability to transmit or receive photo from other optical signals. The wave guide 138 may be, for example, an opening above the photodetector, or a dielectric layer filled into the opening such that light can be totally reflected because of the difference of the refraction index between the air and the dielectric layer structure 137 or between the dielectric layer and the dielectric layer structure 137. The wave guide 138 may also be a convex micro lens, a metal layer formed within the opening that can reflect the tilted light. These embodiments of the wave guide 138 can help to enhance the light transmission and the photo-detection ability of the PIN transistor.

Please refer to FIG. 11. By the afore-mentioned steps, the novel semiconductor photodetector structure in the present invention can be formed. The photodetector structure includes the substrate 100, the deep trench 112, the first doped region 116, the germanium layer 132 on the first doped region 116, the semiconductor layer 134 on the germanium layer 132 and the second doped region 136. The wave guide 138 can transmit light to the photodetector PIN structure (the second doped region 136, the germanium layer 132, and the first doped region 116) and a photo-current is thus generated.

Figure 12:
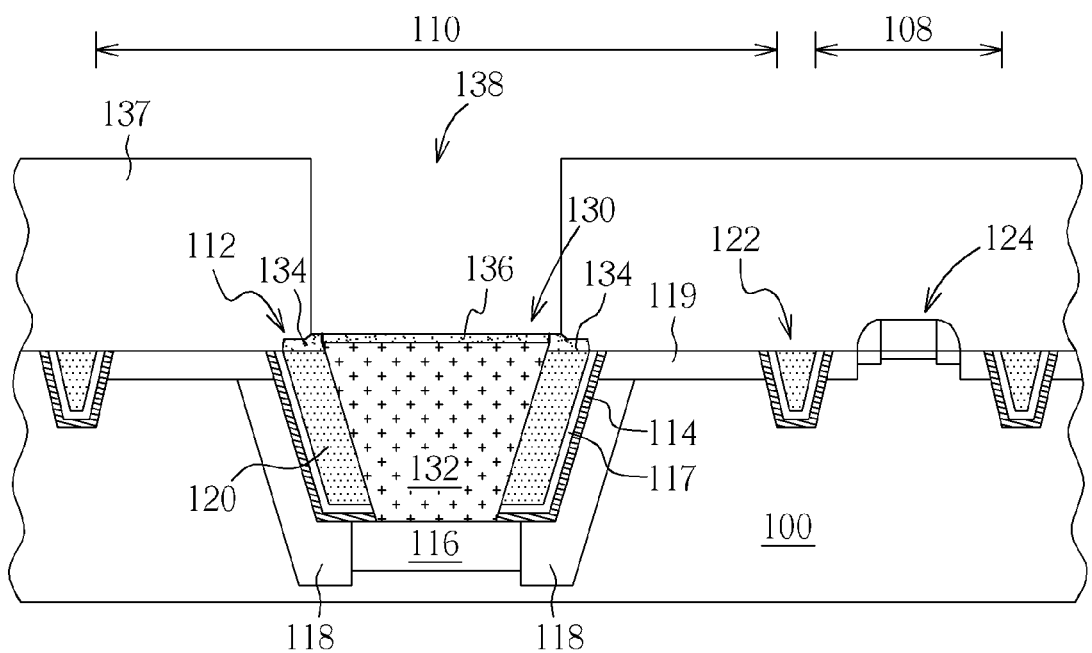
FIG. 12 illustrates the schematic diagram of the semiconductor photodetector structure in another embodiment of the present invention.

In another preferred embodiment in the present invention, when controlling the epitaxial growth condition in a low pressure environment to make the germanium layer grow in a slow rate, the germanium layer 132 will fill the entire second trench 130, as shown in FIG. 12. The germanium layer 132 grows along the sloped sidewall of the second trench 130, so the sidewall of the germanium layer 132 has the similar slope as that in the second trench 130, in the preferred embodiment, the slope is the same as that in the second trench 112. As shown in FIG. 12, using the same steps, the semiconductor layer 134 and the second doped region 136 can also be formed on the germanium layer 132 and the vertical PIN photodetector structure may also be formed.

Accordingly, the present invention provides a semiconductor photodetector structure and the method of making the same. The method is characterized by forming a deep trench in the substrate and selectively growing the germanium layer on the first doped region in the deep trench. The method does not need an etching step or a planarization step such that the dislocation or lattice mismatch phenomenon between the germanium layer and the silicon substrate can be avoided and the roughness of the germanium layer would be better. And by forming different depths of the deep trench, a thicker germanium layer may be obtained which can absorb more photo signal and can increase the sensitivity of the photodetector. Besides, the fabricating method can also integrate with traditional MOS manufacturing processes and is compatible with existing technology and available to general silicon substrate.

Those skilled in the art will readily observe that numerous modifications and alterations of the device and method may be made while retaining the teachings of the invention.

What is claimed is:

1. A semiconductor photodetector structure, comprising:
  a substrate, comprising a first semiconductor material and comprising a deep trench, wherein the surface of the deep trench comprises a first type dopant region which comprises a first type dopant, and the first type dopant region is disposed on a bottom surface of the deep trench wherein an area of the first type dopant region is smaller than the bottom surface of the deep trench;
  a photodetecting element disposed in the deep trench, wherein the photodetecting element comprises a second semiconductor material, and a bottom area of the photodetecting element is smaller than the area of the first type dopant region, and the bottom area of the photodetecting element is substantially parallel to the bottom surface of the deep trench; and
  a semiconductor layer disposed on the photodetecting element, wherein the semiconductor layer comprises a second type dopant.

2. The semiconductor photodetector structure in claim 1, wherein the top surface of the photodetecting element is higher than the surface of the substrate.

3. The semiconductor photodetector structure in claim 1, wherein the deep trench comprises a sloped sidewall.

4. The semiconductor photodetector structure in claim 1, wherein the second semiconductor material comprises germanium.

5. The semiconductor photodetector structure in claim 1, wherein the photodetecting element is partially filled in the deep trench.

6. The semiconductor photodetector structure in claim 1, wherein the shape of the photodetecting element comprises a cylinder or a prism.

7. The semiconductor photodetector structure in claim 1, wherein the semiconductor layer comprises single crystal silicon, amorphous silicon or poly silicon.

8. The semiconductor photodetector structure in claim 1, further comprising a waveguide structure disposed on the photodetecting element, wherein the waveguide structure comprises an opening, a micro lens, a metal layer or a dielectric layer.

9. A semiconductor photodetector structure, comprising:
a substrate, comprising a first semiconductor material and comprising a deep trench, wherein the surface of the deep trench comprises a first type dopant and the deep trench comprises a sloped sidewall;
an dielectric layer in the deep trench;
a second trench disposed in the dielectric layer, wherein a sidewall of the second trench has substantially the same slope as that of the deep trench; and
a photodetecting element disposed in the second trench, wherein the photodetecting element comprises a second semiconductor material, wherein the photodetecting element shrinks from a top surface to a bottom surface.

10. The semiconductor photodetector structure in claim 9, further comprising a semiconductor layer disposed on the photodetecting element, wherein the semiconductor layer comprises a second type dopant.

11. The semiconductor photodetector structure in claim 10, wherein the semiconductor layer comprises single crystal silicon, amorphous silicon or poly silicon.

12. The semiconductor photodetector structure in claim 9, wherein the surface of the photodetecting element comprises a second type dopant.

13. The semiconductor photodetector structure in claim 9, further comprising a mono- or multi-dielectric layer disposed between the photodetecting element and the deep trench.

14. The semiconductor photodetector structure in claim 9, further comprising a waveguide structure disposed on the photodetecting element, wherein the waveguide structure comprises an opening, a micro lens, a metal layer or a dielectric layer.

* * * * *